United States Patent
Lin et al.

(10) Patent No.: US 8,765,545 B2
(45) Date of Patent: Jul. 1, 2014

(54) METHOD OF MANUFACTURING A SEMICONDUCTOR DEVICE

(71) Applicant: Taiwan Semiconductor Manufacturing Company, Ltd., Hsinchu (TW)

(72) Inventors: Mei-Hsuan Lin, Tainan (TW);
Chih-Kang Chao, Tainan (TW);
Chih-Hsun Lin, Tainan (TW);
Ling-Sung Wang, Tainan (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 13/905,893

(22) Filed: May 30, 2013

(65) Prior Publication Data
US 2013/0267069 A1  Oct. 10, 2013

Related U.S. Application Data

(63) Continuation of application No. 13/234,296, filed on Sep. 16, 2011, now Pat. No. 8,470,660.

(51) Int. Cl.
*H01L 21/8238* (2006.01)

(52) U.S. Cl.
USPC .................................. 438/222; 438/221

(58) Field of Classification Search
CPC ............... H01L 21/76248; H01L 21/76224
USPC .......................... 438/221, 222, 424
See application file for complete search history.

(56) References Cited

U.S. PATENT DOCUMENTS

| | | | |
|---|---|---|---|
| 2004/0188723 A1 | 9/2004 | Sugawara et al. | |
| 2008/0116482 A1* | 5/2008 | Chong et al. | 257/190 |
| 2013/0071995 A1 | 3/2013 | Lin et al. | |

* cited by examiner

*Primary Examiner* — Bradley K Smith
(74) *Attorney, Agent, or Firm* — Haynes and Boone, LLP

(57) ABSTRACT

A method of manufacturing a semiconductor device is disclosed. The exemplary method includes providing a substrate having a source region and a drain region. The method further includes forming a first recess in the substrate within the source region and a second recess in the substrate within the drain region. The first recess has a first plurality of surfaces and the second recess has a second plurality of surfaces. The method also includes epi-growing a semiconductor material in the first and second recesses and, thereafter, forming shallow isolation (STI) features in the substrate.

20 Claims, 9 Drawing Sheets

METHOD OF MANUFACTURING A SEMICONDUCTOR DEVICE

PRIORITY DATA

This patent application is a continuation of U.S. patent application Ser. No. 13/234,296 filed Sep. 16, 2011, the entire disclosure of which is hereby incorporated by reference.

BACKGROUND

The semiconductor integrated circuit (IC) industry has experienced rapid growth. In the course of the IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as the semiconductor industry has progressed into nanometer technology process nodes in pursuit of higher device density, higher performance, and lower costs, the semiconductor industry has experienced challenges in manufacturing field-effect transistors (FETs). Although methods of fabricating FET devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
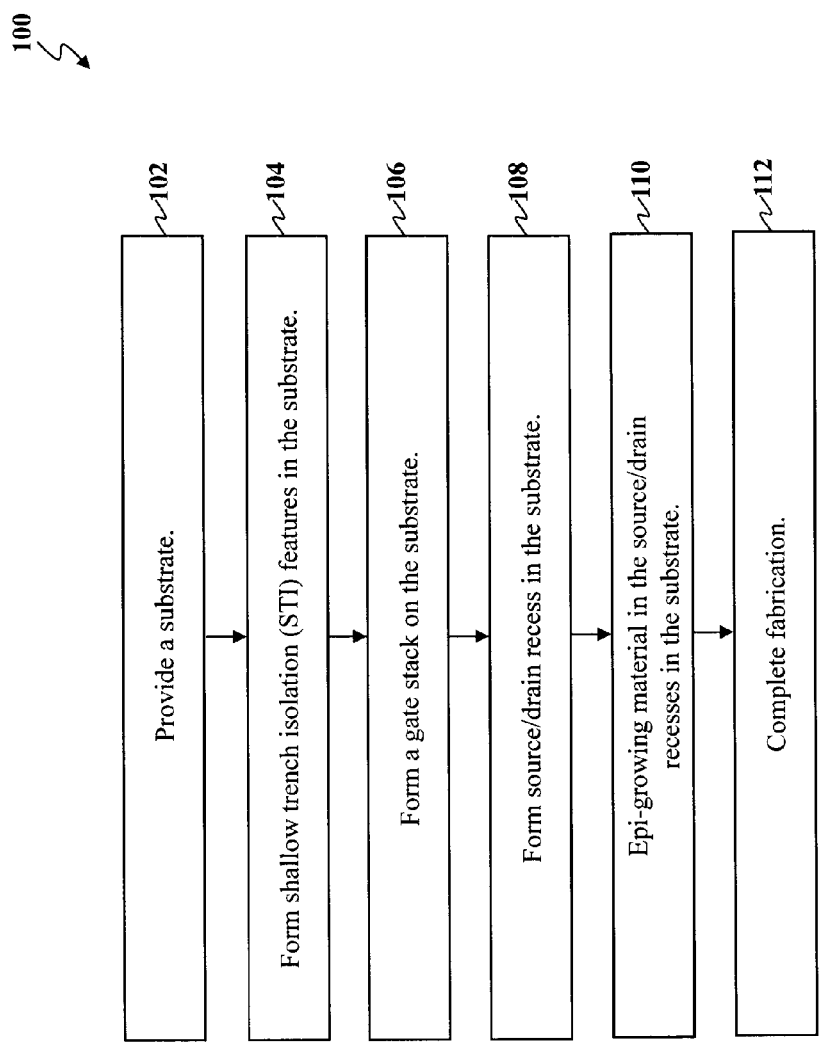
FIG. 1 is a flowchart illustrating a method of forming a semiconductor device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, a method 100 for fabricating a semiconductor device is described according to various aspects of the present disclosure. The method 100 begins with step 102 in which a substrate is provided. The method 100 continues with step 104 in which shallow trench isolation (STI) features are formed in the substrate. At step 106, gate stacks are formed on the substrate. At step 108, a plurality of recess are formed in the substrate. The recess define source/drain regions. The method 100 continues at step 110 in which a semiconductor material is epitaxially grown (epi-grown) in the plurality of recess in the substrate. The method 100 continues at step 112 in which fabrication of the integrated circuit device is completed. Additional steps can be provided before, during, and after the method 100, and some of the steps described can be replaced or eliminated for other embodiments of the method. The discussion that follows illustrates various embodiments of an integrated circuit device that can be fabricated according to the method 100 of FIG. 1.

Figure 2:
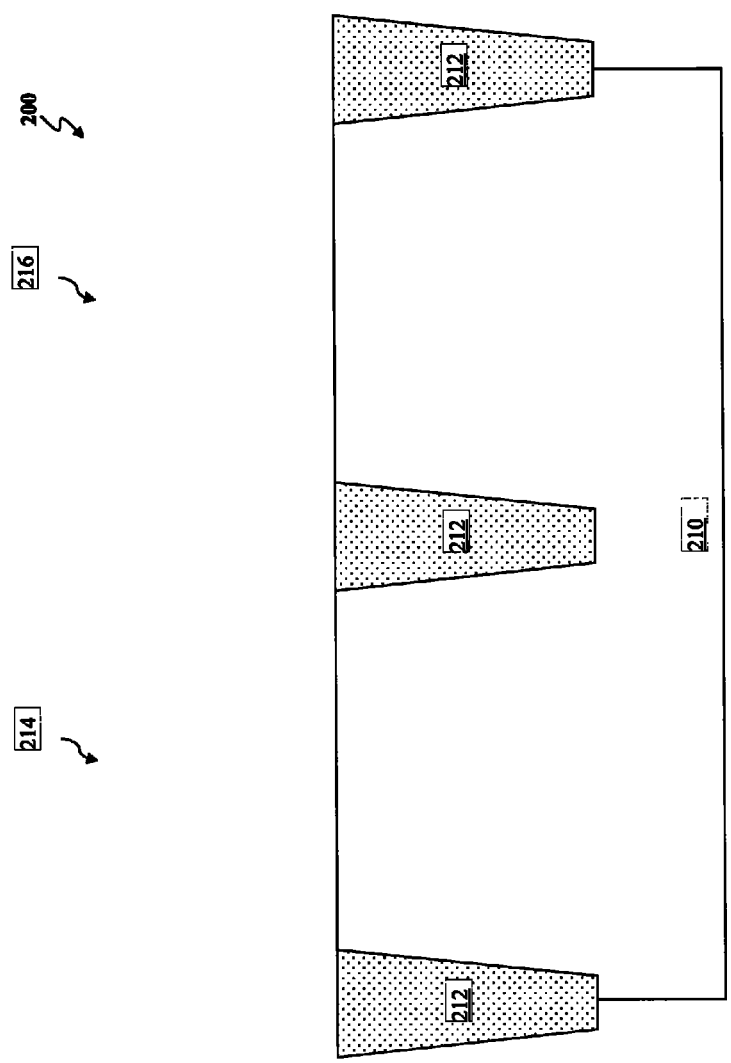
FIGS. 2 to 5 illustrate diagrammatic cross-sectional side views of one embodiment of a semiconductor device at various stages of fabrication according to the method of FIG. 1.

FIGS. 2 to 5 illustrate diagrammatic cross-sectional side views of one embodiment of a semiconductor device 200 at various stages of fabrication according to the method 100 of FIG. 1. Referring to FIG. 2, the semiconductor device 200 includes a substrate 210. In the present embodiment, the substrate 210 is a semiconductor substrate including silicon. In an example, the substrate 210 includes an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof Where the substrate 210 is an alloy semiconductor, the alloy semiconductor substrate could have a gradient SiGe feature in which the Si and Ge composition change from one ratio at one location to another ratio at another location of the gradient SiGe feature. The alloy SiGe could be formed over a silicon substrate, and/or the SiGe substrate may be strained. In yet another example, the semiconductor substrate could be a semiconductor on insulator (SOI). The SOI substrate can be fabricated using separation by implantation of oxygen (SIMOX), wafer bonding, and/or other suitable methods.

Still referring to FIG. 2, shallow trench isolation (STI) features 212 are formed in the substrate 210 for isolation purposes. The STI features 212 are formed by etching a plurality of trenches in the substrate 210. In the present embodiment, the formation of the plurality of trenches includes using a hard mask layer. A photolithography process and an etching process may be used to pattern the hard mask layer. An exemplary photolithography process may include photoresist patterning, etching, and photoresist stripping. The photoresist patterning may further include processing steps of photoresist coating, soft baking, mask aligning, exposing pattern, post-exposure baking, developing photoresist, and hard baking. Photolithography patterning may also be implemented or replaced by other proper methods, such as maskless photolithography, electron-beam writing, ion-beam writing, and molecular imprint. The etching process may include a wet etching or dry etching process, or a combination thereof The etching process uses the patterned hard mask layer to define the area to be etched and to protect other regions of the semiconductor device 200. In one example, a hydrofluoric acid (HF) or buffered HF may be used to etch the dielectric layer to expose the substrate 210 within the openings defined by the hard mask layer. In one example, a dry etching process used to etch the substrate 210 includes a chemistry including fluorine-containing gas. In furtherance of the example, the chemistry of the dry etch includes $CF_4$, $SF_6$, or $NF_3$.

Each of the plurality of trenches of the STI features 212 are filled with an isolation material. The isolation material may include a dielectric material such as silicon oxide, silicon nitride, silicon oxynitride, low k materials, air gap, other suitable material, or combinations thereof In the present embodiment, the isolation material includes silicon oxide. The silicon oxide can be deposited in the plurality of trenches by a CVD process. In various examples, the silicon oxide can be formed by physical vapor deposition (PVD), atomic layer deposition (ALD), high density plasma CVD (HDPCVD), other suitable methods, and/or combinations thereof. The silicon oxide may be alternatively formed by a high aspect ratio process (HARP). In various embodiments, an optional thermal oxide trench liner may be grown to improve the trench interface. The CVD process, for example, may use chemicals including Hexachlorodisilane (HCD or Si2Cl6), Dichlorosilane (DCS or SiH2Cl2), Bis(TertiaryButylAmino) Silane (BTBAS or C8H22N2Si) and Disilane (DS or Si2H6). A planarizing process may be performed on the semiconductor device 200. In one embodiment, the planarizing process includes a chemical mechanical polishing (CMP) process applied to the substrate 210 to remove excessive portions of the trench-filling isolation material. As one example, the CMP process can use a silicon nitride layer as a polishing stop layer so that the CMP process can properly stop at the silicon nitride layer.

The STI features 212 are operable to isolate device regions. For example, the semiconductor device 200 includes a first device region 214 and a second device region 216. The first device region 214 may define, for example, a N-type metal-oxide-semiconductor transistor (referred to as an NMOS) region and the second device region 218 may define, for example, a P-type metal-oxide-semiconductor transistor (referred to as a PMOS) region. For example, the NMOS and PMOS device regions may include doped regions. The doped regions may be doped with p-type dopants, such as boron or $BF_2$, and/or n-type dopants, such as phosphorus or arsenic. Although the present embodiment illustrates a NMOS and a PMOS device region, the methods described herein are understood to be applicable to other devices which are known in the art.

Figure 3:
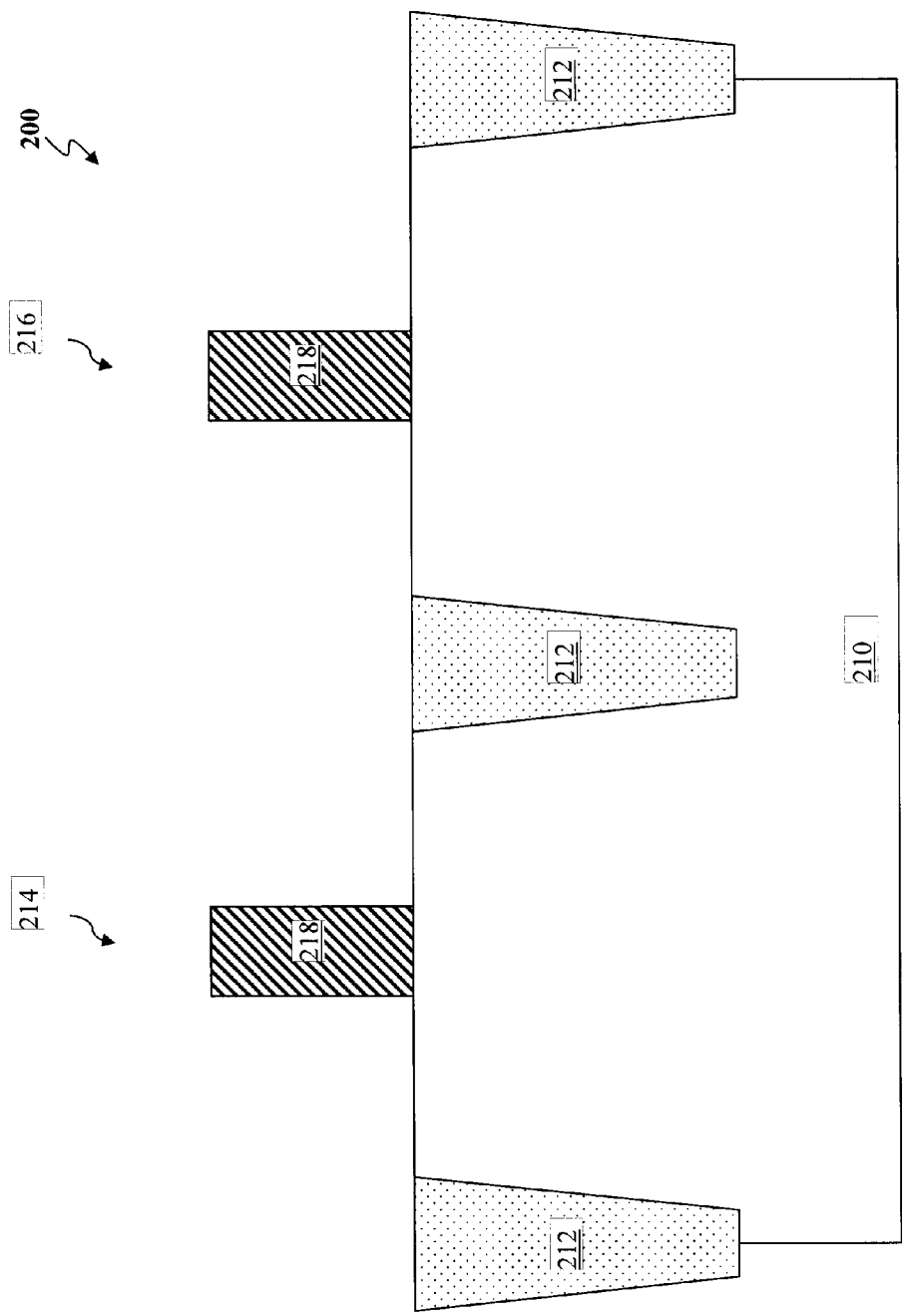

With reference to FIG. 3, gate stacks 218 are formed in the NMOS region 214 and the PMOS region 216 of the semiconductor device 200. The gate stack 218 includes a gate dielectric layer and a gate electrode. One or more additional layers, for example, interface layers, capping layers, and the like may also be provided in the gate stack 218. In an embodiment, the gate stack 218 includes a high k dielectric material layer and a conductive layer formed on the high k dielectric layer (e.g., a gate electrode). The conductive layer may include polysilicon, Al, Cu, Ti, TiN, TaN, Ta, TaC, TaSiN, W, WN, MoN, MoON, $RuO_2$, and/or other suitable materials. The gate stack 218 may include a gate dielectric such as, silicon oxide, silicon nitride, silicon oxynitride, and/or other suitable materials. In an embodiment, the gate stack 218 includes a high-k gate dielectric such as metal oxides, metal nitrides, metal silicates, transition metal-oxides, transition metal-nitrides, transition metal-silicates, oxynitrides of metals, metal aluminates, zirconium silicate, zirconium aluminate, combinations thereof, or other suitable compositions. Example high-k dielectrics include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), combinations thereof, and/or other suitable materials. Alternatively, the high-k dielectric layer may include other high-k dielectrics such as LaO, AlO, ZrO, TiO, $Ta_2O_5$, $Y_2O_3$, $SrTiO_3$ (STO), $BaTiO_3$ (BTO), BaZrO, HfLaO, HfSiO, LaSiO, AlSiO, (Ba, Sr)$TiO_3$ (BST), $Al_2O_3$, $Si_3N_4$, and/or other suitable materials.

The gate stack 218 is formed by a suitable process, including deposition, lithography patterning, and etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof The lithography patterning processes include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography exposing process is implemented or replaced by other methods, such as maskless photolithography, electron-beam writing, and ion-beam writing. In yet another alternative, the lithography patterning process could implement nanoimprint technology. The etching processes include dry etching, wet etching, and/or other etching methods.

Figure 4:
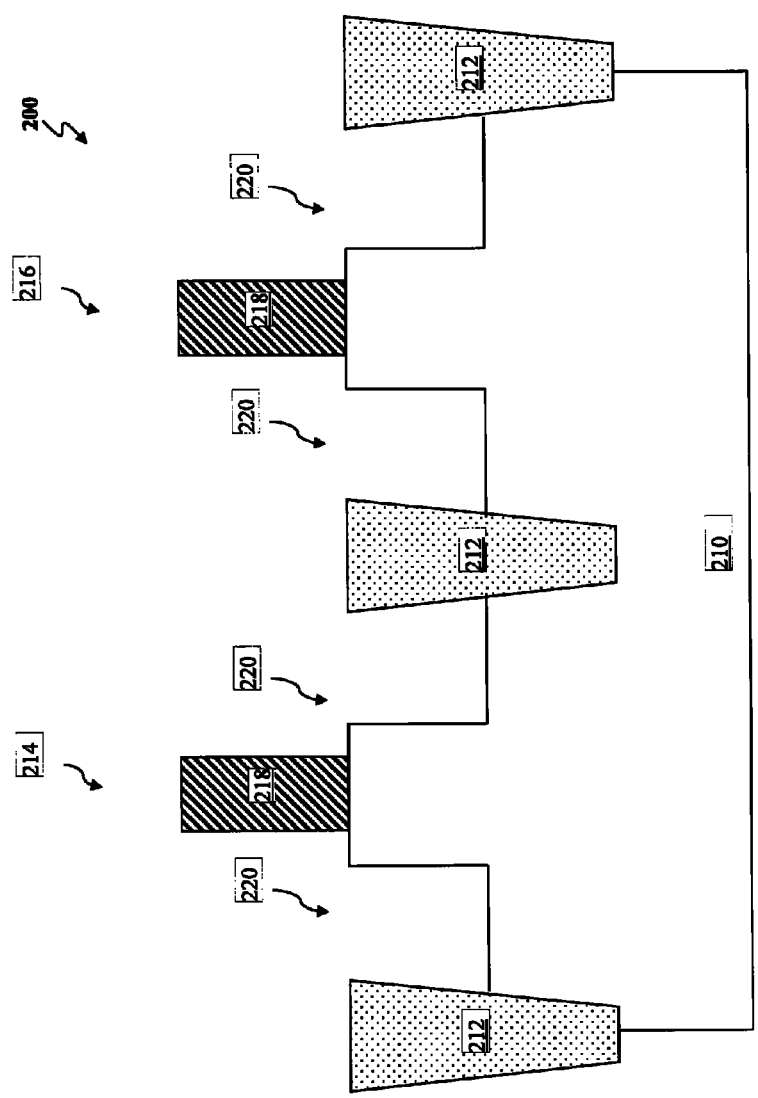

Referring to FIG. 4, the semiconductor device 200 also includes a source and a drain region 220 formed in the substrate 210 and disposed on two sides of the gate stack 218. The source and drain region 220 are formed by etching a plurality of recess in the substrate 210. In the present embodiment, the formation of the plurality of recesses includes using a hard mask layer. A photolithography process and an etching process may be used to pattern the hard mask layer. An exemplary photolithography process may include photoresist patterning, etching, and photoresist stripping. The photoresist patterning may further include processing steps of photoresist coating, soft baking, mask aligning, exposing pattern, post-exposure baking, developing photoresist, and hard baking. Photolithography patterning may also be implemented or replaced by other proper methods, such as maskless photolithography, electron-beam writing, ion-beam writing, and molecular imprint. The etching process may include a wet etching or dry etching process, or a combination thereof The etching process uses the patterned hard mask layer to define the area to be etched and to protect other regions of the semiconductor device 200. In one example, a hydrofluoric acid (HF) or buffered HF may be used to etch the dielectric layer to expose the substrate 210 within the openings defined by the hard mask layer. In one example, a dry etching process used to etch the substrate 210 includes a chemistry including fluorine-containing gas. In furtherance of the example, the chemistry of the dry etch includes $CF_4$, $SF_6$, or $NF_3$.

Figure 5:
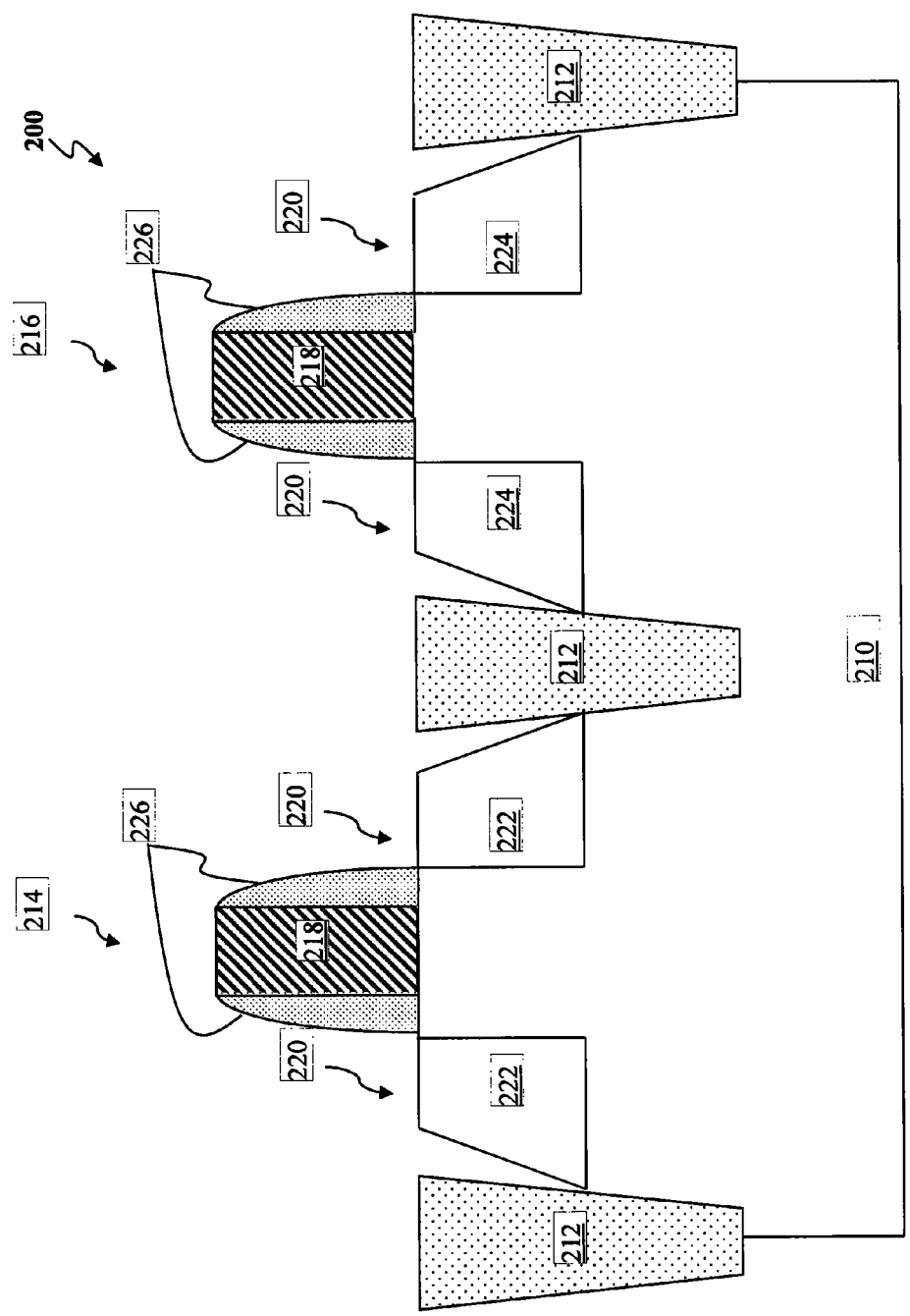

Referring to FIG. 5, each of the plurality of recesses of the source and drain region 220 are filled with a semiconductor material 222 and 224. The semiconductor material 222 and 224 may have either a compressive stress characteristic or a tensile stress characteristic. The semiconductor material 222 and 224 may include SiGe, SiC, or other suitable material. In the present embodiment, the source and drain region 220 in the NMOS region 214 includes material 222 which is, for example, SiC grown using suitable processes. For example, the SiC may be grown using an epitaxy process (epi-growing). The epitaxy process may include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the substrate 210 (e.g., silicon). In a further embodiment, the source and drain region 220 in the PMOS region 216 includes material 224 which is, for example, SiGe grown using suitable processes. For example, the SiGe may be grown using an epitaxy process (epi-growing). The epitaxy process may include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the substrate 210 (e.g., silicon). The source/drain regions described are exemplary only and in alternative embodiments may include any lightly doped source/drain regions and/or heavily doped source/drain regions formed by suitable methods, selected for the desired transistor configuration.

The semiconductor device 200 further includes a gate spacer 226 disposed on the sidewalls of the gate stack 218. The gate spacer 226 may be used to define a portion of the source/drain region 220. In an embodiment, the gate spacers 226 define a low-dose implant region (e.g., low dose drain, ldd). After defining the source/drain region, the gate spacers 226 may be etched back. In an embodiment, the gate spacers 226 include silicon nitride. Other example compositions include silicon oxide, silicon carbide, silicon oxynitride, combinations thereof, or other suitable materials. Typical formation methods for the gate spacers 226 include depositing a dielectric material and then anisotropically etching back the material. The spacers 226 may have a multi-layer structure. In an embodiment, the gate spacers 226 include different layers such that different layers/portions provide a different functionality, for example: a wall for a gate element used in a replacement gate process, and/or definition of a low-dose source/drain region.

As illustrated in FIG. 5, epi-growing the semiconductor material 222 and 224 in the plurality of recess may result in the material having growth variations and/or irregularities (see material 222 and 224 adjacent to STI features 212). These growth variations result from epi-growing semiconductor material on different materials. For example, the epi-growth process grows material on both the substrate 210 (e.g., semiconductor) and the wall of the STI features 212 (e.g., dielectric). Because the materials for these surfaces differ the epi-growth rate on these materials will also differ. Certain devices are insensitive to the variation and therefore, regardless of the variation, such devices may benefit from the disclosed embodiment of method 100. The variation, however, may adversely affect the performance of other devices. As will be discussed further below, the epi-growth variation may be minimized or even eliminated by alternative embodiments. It is understood that different embodiments may have different advantages, and no particular advantage is necessarily required of any embodiment.

Figure 6:
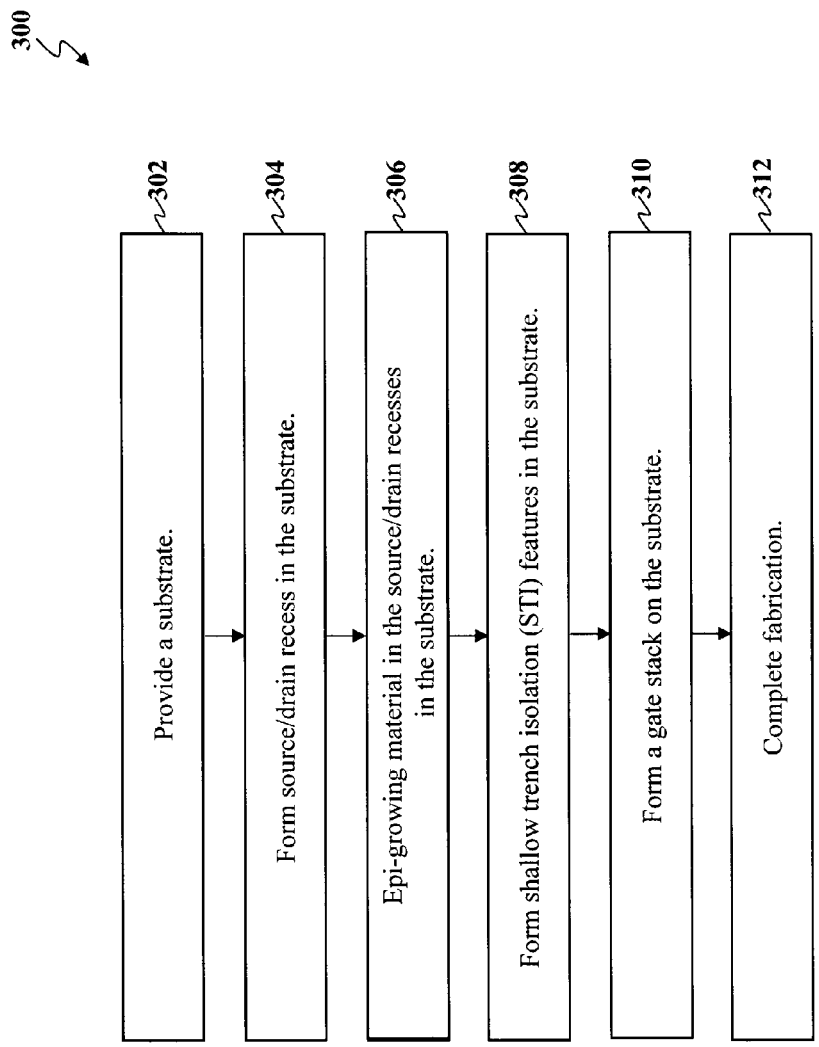
FIG. 6 is a flowchart illustrating a method of forming a semiconductor device according to various aspects of the present disclosure.

Referring to FIG. 6, a method 300 for fabricating a semiconductor device is described according to various aspects of the present disclosure. The embodiment of method 300 may include similar process steps as an embodiment of the method 100 which is disclosed above. In disclosing the embodiment of method 300, some details regarding processing and/or structure may be skipped for simplicity if they are similar to those described in the embodiment of method 100. The method 300 begins with step 302 in which a substrate is provided. The method 300 continues with step 304 in which a plurality of recess are formed in the substrate. The recess define source/drain regions. At step 306, a semiconductor material is epitaxially grown (epi-grown) in the plurality of recess in the substrate. The method 300 continues at step 308 in which shallow trench isolation (STI) features are formed in the substrate. At step 310, gate stacks are formed on the substrate. The method 300 continues at step 312 in which fabrication of the integrated circuit device is completed. Additional steps can be provided before, during, and after the method 300, and some of the steps described can be replaced or eliminated for other embodiments of the method. The discussion that follows illustrates various embodiments of an integrated circuit device that can be fabricated according to the method 300 of FIG. 6.

Figure 7:
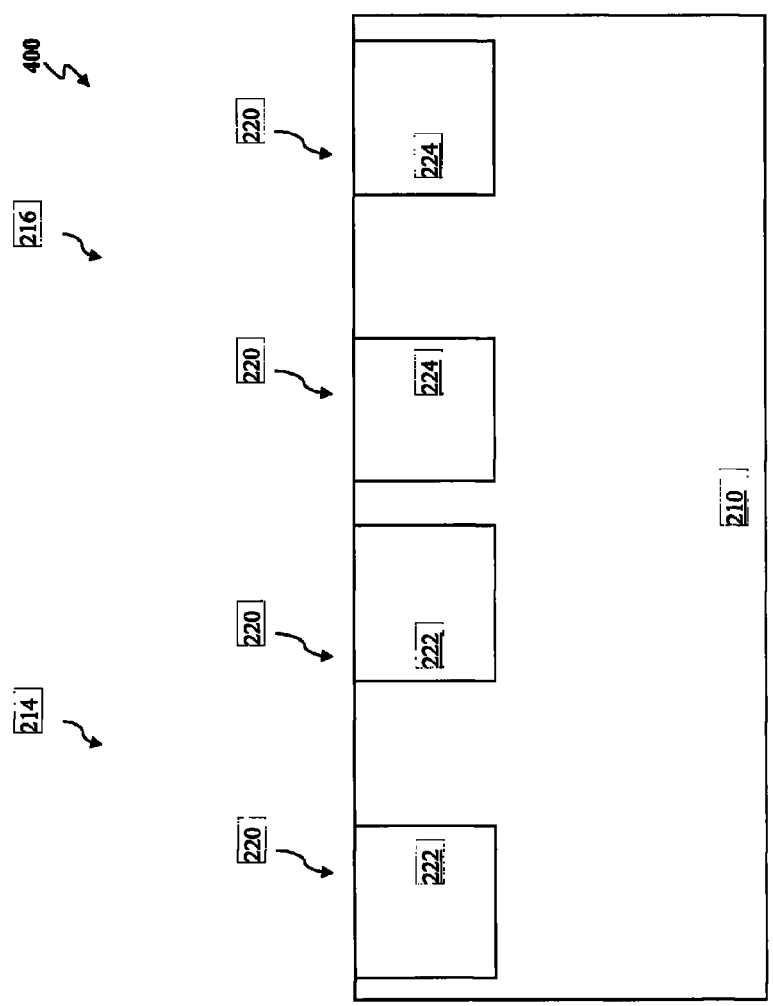
FIGS. 7 to 9 illustrate diagrammatic cross-sectional side views of one embodiment of a semiconductor device at various stages of fabrication according to the method of FIG. 6.
Figure 8:
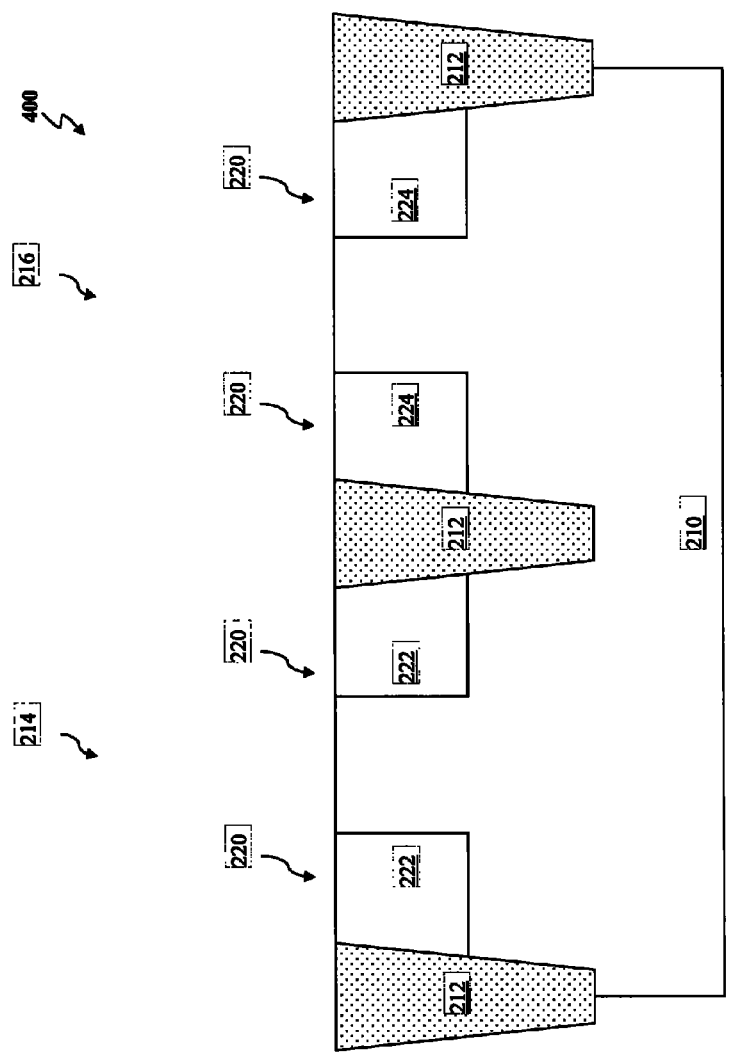
Figure 9:
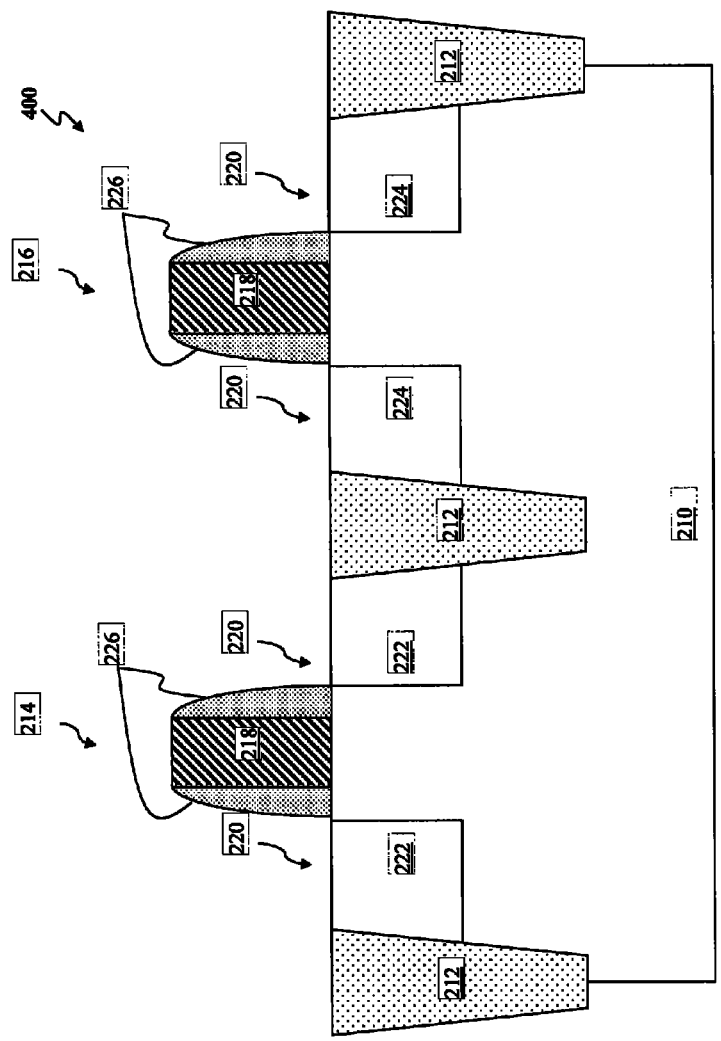

FIGS. 7 to 9 illustrate diagrammatic cross-sectional side views of one embodiment of a semiconductor device 400 at various stages of fabrication according to the method 300 of FIG. 6. The semiconductor device 400 of FIGS. 7-9 is similar in certain respects to the semiconductor device 200 of FIGS. 2-5. Accordingly, similar features in FIGS. 2-5 and FIGS. 7-9 are identified by the same reference numerals for clarity and simplicity.

Referring to FIG. 7, the semiconductor device 400 includes a substrate 210. In the present embodiment, the substrate 210 defined in the semiconductor device 400 is substantially similar to the substrate 210 of the semiconductor device 200 in terms of composition, formation and configuration. In an alternative embodiment, they are different.

With further reference to FIG. 7, the semiconductor device 400 includes a NMOS region 214 and a PMOS region 216. The semiconductor device 400 also includes a source and a drain region 220. The source and drain region 220 are formed by etching a plurality of recess in the substrate 210. In the present embodiment, the plurality of recess defined in the semiconductor device 400 are substantially similar to the recess defined in the semiconductor device 200 in terms of formation and configuration. In an alternative embodiment, they are different.

Each of the plurality of recesses of the source and drain region 220 are filled with a semiconductor material 222 and 224. In the present embodiment, the source and drain region 220 in the NMOS region 214 includes material 222 which is, for example, SiC grown using suitable processes. For example, the SiC may be grown using an epitaxy process. The epitaxy process may include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the substrate 210 (e.g., silicon). In a further embodiment, the source and drain region 220 in the PMOS region 216 includes material 224 which is, for example, SiGe grown using suitable processes. For example, the SiGe may be grown using an epitaxy process. The epitaxy process may include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the substrate 210 (e.g., silicon). The source/drain regions described are exemplary only and in alternative embodiments may include any lightly doped source/drain regions and/or heavily doped source/drain regions formed by suitable methods, selected for the desired transistor configuration.

Referring to FIG. 8, the semiconductor device 400 also includes STI features 212 formed in the substrate 210 for isolation. The STI features 212 are formed by etching a plurality of trenches in the substrate 210 and by partially etching the semiconductor material 222 and 224. In the present embodiment, the STI features 212 defined in the semiconductor device 400 are substantially similar to the STI features 212 defined in the semiconductor device 200 in terms of composition, formation, and configuration. In an alternative embodiment, they are different.

Referring to FIG. 9, gate stacks 218 are formed in the NMOS region 214 and the PMOS region 216 of the semiconductor device 400. In the present embodiment, the gate stacks 218 defined in the semiconductor device 400 are substantially similar to the gate stacks 218 defined in the semiconductor device 200 in terms of composition, formation, and configuration. In an alternative embodiment, they are different.

Still referring to FIG. 9, the semiconductor device 400 further includes a gate spacer 226 disposed on the sidewalls of the gate stack 218. In the present embodiment, the gate spacers 226 defined in the semiconductor device 400 are substantially similar to the gate spacers 226 defined in the semiconductor device 200 in terms of composition, formation, and configuration. In an alternative embodiment, they are different.

As illustrated in FIG. 9, the method 300 may serve to minimize or even eliminate epi-growth variation of the semiconductor material 222 and 224 in the plurality of recess of the source and drain regions 220. The minimized epi-growth variation, achieved by the disclosed method 300, results from the sequence of the method 300. In particular, the method 300 provides for first epi-growing the semiconductor material 222 and 224 and then forming the STI features 212. Because the epi-growing process only grows semiconductor material on the substrate 210 (as the STI features 212 are formed later) the growth rate is substantially the same on all surfaces. Thus, the method 300 serves to minimize or even eliminate epi-growth variation of the semiconductor material 222 and 224 within the source and drain region 220. The minimized epi-growth variation may serve to provide more reliable device performance. Further, the method disclosed for achieving the semiconductor device described herein is easily implemented into current processing. It is understood that different embodiments may have different advantages, and no particular advantage is necessarily required of any embodiment.

Examples of devices that can benefit from one or more embodiments of the present invention are semiconductor devices with field effect transistors (FET). Such a device, for example, may include metal-oxide-semiconductor field effect transistors (MOSFETs), complementary metal-oxide-semiconductor (CMOS) transistors, fin-like field effect transistors (FinFETs), high voltage transistors, and/or high frequency transistors; other suitable components; and/or combinations thereof. The semiconductor device may additionally include passive components, such as resistors, capacitors, inductors, and/or fuses. It is understood that certain features of the semiconductor device may be formed by well known technology processing, and thus some processes are not described in detail herein.

For example, the semiconductor device 200, 400, may be included in subsequent processing to form a PMOS device. The PMOS device may include additional features, which may be formed by subsequent processing. For example, subsequent processing may further form various contacts/vias/lines and multilayer interconnect features (e.g., metal layers and interlayer dielectrics) on the substrate, configured to connect the various features or structures of the PMOS device. The additional features may provide electrical interconnection to the device. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structures.

Thus, provided is a method to manufacture a semiconductor device. The exemplary method includes providing a substrate having a source region and a drain region. The method further includes forming a first recess in the substrate within the source region and a second recess in the substrate within the drain region. The first recess has a first plurality of surfaces and the second recess has a second plurality of surfaces. The method also includes epi-growing a semiconductor material in the first and second recesses and, thereafter, forming shallow isolation (STI) features in the substrate.

In some embodiments the method may further comprise, after forming the STI feature, forming a gate stack on the substrate and forming a gate spacer abutting the gate stack. In certain embodiments epi-growing has a epi-growth rate that is substantially the same on the first plurality of surfaces and on the second plurality of surfaces. In various embodiments, the first plurality of surfaces and the second plurality of surfaces include the same material. In some embodiments, the epi-grown semiconductor material includes one of SiGe or SiC. In further embodiments, forming the STI features includes etching part of the epi-grown semiconductor material and part of the substrate to form a plurality of trenches and forming the STI features further includes depositing a dielectric material in the plurality of trenches. The dielectric material being adjacent to and in direct contact with the epi-grown semiconductor material.

Also provided is an alternative embodiment of a method for manufacturing a semiconductor device. The method includes providing a semiconductor substrate having a source region and a drain region and a channel region therebetween. Forming a recess in the source region and a recess in the drain region. Epi-growing a semiconductor material in the recess of the source region and in the recess of the drain region. Forming a shallow trench isolation (STI) feature adjacent to the source and the drain region. The STI feature being operable to isolate the semiconductor device. Further, the method includes forming a gate stack on the semiconductor substrate. The gate stack being formed over the channel region and between the source region and the drain region.

In some embodiments, the method further comprises forming a gate spacer abutting the gate stack. In some embodiments, forming the recess in the source region and the recess in the drain region includes an etching process. In various embodiments, the etching process is a dry etching process. In further embodiments, the epi-growing has a epi-growth rate, the epi-growth rate being substantially the same within the recess of the source region and within the recess of the drain region. In various embodiments, the epi-grown semiconductor material includes SiGe or SiC. In certain embodiments, forming the STI feature includes etching the epi-grown semiconductor material and the semiconductor substrate to form a plurality of trenches and depositing a dielectric material in the plurality of trenches.

Also provided is yet another alternative embodiment of a method for manufacturing a semiconductor device. The method includes providing a semiconductor substrate having a PMOS region and a NMOS region. Forming a first plurality of recesses in the PMOS region and a second plurality of recess in the NMOS region The first plurality of recesses in the PMOS region defining a PMOS source and drain region and the second plurality of recess in the NMOS region defining a NMOS source and drain region. Epi-growing a first semiconductor material in the first plurality of recesses and a second semiconductor material in the second plurality of recess. The first semiconductor material having a first stress characteristic and the second semiconductor material having a second stress characteristic. Forming a shallow trench isolation (STI) feature. The STI feature being operable to isolate the PMOS region and the NMOS region. Forming a first gate stack on a substrate. The first gate stack being formed between the PMOS source and drain region. The method further includes forming a second gate stack on a substrate. The second gate stack being formed between the NMOS source and drain region.

In some embodiments, the method further comprises forming a first gate spacer abutting the first gate stack and a second gate spacer abutting the second gate stack. In certain embodiments, forming the first plurality of recess in the PMOS region and forming a second plurality of recess in the NMOS region includes a dry etching process. In various embodiments, the first semiconductor material includes SiGe and the second semiconductor material includes SiC. In further embodiments, the first stress characteristic is compressive and the second stress characteristic is tensile The above disclosure provides many different embodiments, or examples, for implementing different features of the invention. Specific examples of components and arrangements are described above to simplify the present disclosure. These are, of course, merely examples and are not intended to be limiting. Accordingly, the components disclosed herein may be arranged, combined, or configured in ways different from the exemplary embodiments shown herein without departing from the scope of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing, comprising:
    forming a first recess within a source region of a substrate and a second recess within a drain region of the substrate by etching a top surface of the substrate, the first recess having a first plurality of surfaces and the second recess having a second plurality of surfaces;
    forming a semiconductor material in the first recess of the source region and in the second recess of the drain region;
    etching the top surface of the substrate adjacent to the source and drain regions thereby forming a trench and exposing a surface of the semiconductor material in the source and drain regions; and
    depositing a dielectric material in the trench thereby forming shallow trench isolation (STI) feature.

2. The method of claim 1 further comprising:
    after forming the STI feature, forming a gate stack on the substrate.

3. The method of claim 2 further comprising:
    forming a gate spacer abutting the gate stack.

4. The method of claim 1 wherein forming the semiconductor material includes epi-growing the semiconductor material.

5. The method of claim 4 wherein the epi-growing has a epi-growth rate, the epi-growth rate being substantially the same on the first plurality of surfaces and on the second plurality of surfaces.

6. The method of claim 4 wherein the epi-grown semiconductor material includes one of SiGe or SiC.

7. The method of claim 1 wherein first plurality of surfaces and the second plurality of surfaces include the same material.

8. The method of claim 1 wherein the dielectric material is in direct contact with the semiconductor material.

9. A method for manufacturing a semiconductor device, comprising:
    forming a first plurality of recesses in a PMOS region of a substrate and a second plurality of recess in a NMOS region of the substrate, the first plurality of recesses in the PMOS region defining a PMOS source and drain region and the second plurality of recess in the NMOS region defining a NMOS source and drain region;
    forming a first semiconductor material in the first plurality of recesses and a second semiconductor material in the second plurality of recess, the first semiconductor material having a first stress characteristic and the second semiconductor material having a second stress characteristic; and
    after forming the first and second semiconductor materials, forming a shallow trench isolation (STI) feature between the PMOS region and the NMOS region.

10. The method of claim 9 further comprising:
    forming a first gate stack on the substrate, the first gate stack being formed between the PMOS source and drain region;
    forming a second gate stack on the substrate, the second gate stack being formed between the NMOS source and drain region; and
    forming a first gate spacer abutting the first gate stack and a second gate spacer abutting the second gate stack.

11. The method of claim 9 wherein forming the first plurality of recess in the PMOS region and forming a second plurality of recess in the NMOS region includes a dry etching process.

12. The method of claim 9 wherein the first semiconductor material includes SiGe and the second semiconductor material includes SiC.

13. The method of claim 9 wherein the first stress characteristic is compressive and the second stress characteristic is tensile.

14. A method of manufacturing, comprising:
    providing a semiconductor substrate including a first device region and a second device region, wherein the first device region includes a first source and drain region, and wherein the second device region includes a second source and drain region;
    forming a first plurality of recesses in the first source and drain region and a second plurality of recess in the second source and drain region;
    forming a first semiconductor material in first plurality of recesses;
    forming a second semiconductor material in second plurality of recesses; and
    after forming the first and second semiconductor materials, forming a shallow trench isolation (STI) feature operable to isolate the first device region and the second device region.

15. The method of claim 14 further comprising:
    forming a first gate stack in the first device region; and
    forming a second gate stack in the second device region.

16. The method of claim 14 wherein the first device region is a PMOS device region and the second device region is a NMOS device region.

17. The method of claim 14 wherein the first semiconductor material includes SiGe and the second semiconductor material includes SiC.

18. The method of claim 14 wherein forming the first plurality of recess in the first device region and forming the second plurality of recess in the second device region includes a dry etching process.

19. The method of claim 14 wherein forming the STI feature includes etching part of the substrate, part of the first semiconductor material, and part of the second semiconductor material.

20. The method of claim 14 wherein first device region includes a first channel region and the second device region includes a second channel region,
  wherein forming the first semiconductor material includes epi-growing the first semiconductor material in the first plurality of trenches without epi-growing the first semiconductor material in part of the first channel region, and
  wherein forming the second semiconductor material includes epi-growing the second semiconductor material in the second plurality of trenches without epi-growing the second semiconductor material in part of the second channel region.

\* \* \* \* \*